(12) United States Patent
Moore et al.

(10) Patent No.: US 10,716,240 B2
(45) Date of Patent: Jul. 14, 2020

(54) DEFLECTION OF HEATED AIR FROM A POSTERIOR ELECTRICAL COMPONENT

(71) Applicant: HEWLETT PACKARD ENTERPRISE DEVELOPMENT LP, Houston, TX (US)

(72) Inventors: David A. Moore, Houston, TX (US); John Franz, Houston, TX (US); Jonathon Hughes, Houston, TX (US); Rahul V. Joshi, Houston, TX (US); John Vijil, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/078,224

(22) PCT Filed: Feb. 23, 2016

(86) PCT No.: PCT/US2016/019107
§ 371 (c)(1),
(2) Date: Aug. 21, 2018

(87) PCT Pub. No.: WO2017/146684
PCT Pub. Date: Aug. 31, 2017

(65) Prior Publication Data
US 2019/0059178 A1    Feb. 21, 2019

(51) Int. Cl.
*H05K 7/20*    (2006.01)
*G06F 1/20*    (2006.01)

(52) U.S. Cl.
CPC .......... *H05K 7/20736* (2013.01); *G06F 1/20* (2013.01); *H05K 7/2039* (2013.01); *H05K 7/20145* (2013.01); *H05K 7/20727* (2013.01)

(58) Field of Classification Search
CPC .......... H01L 2924/0002; H01L 23/467; H01L 2224/48091; H01L 23/3672; H01L 23/473;
(Continued)

(56) References Cited

U.S. PATENT DOCUMENTS

| 5,195,576 A | 3/1993 | Hatada et al. |
| 6,462,948 B1 | 10/2002 | Leija et al. |

(Continued)

FOREIGN PATENT DOCUMENTS

| CN | 201000600 Y | 1/2008 |
| JP | 08215737 | 8/1996 |
| JP | 2000130399 A | 5/2000 |

OTHER PUBLICATIONS

International Search Report and Written Opinion, International Application No. PCT/US2016/019107, dated Nov. 18, 2016, pp. 1-10, KIPO.

*Primary Examiner* — Mandeep S Buttar
(74) *Attorney, Agent, or Firm* — Hewlett Packard Enterprise Patent Department (57) ABSTRACT

Examples herein disclose a multi-channel apparatus include a first channel and a second channel. The first channel receives heated air from an electrical component. The first channel deflects the heated air from a posterior electrical component. The deflection of the heated air is caused by a curvature of an internal partition. The second channel, which is segmented from the first channel via the internal partition, provides cool air to the posterior electrical component.

14 Claims, 8 Drawing Sheets

(58) Field of Classification Search
CPC ...... G06F 1/20; G06F 1/181; G06F 2200/201;
H05K 7/20727; H05K 7/20145; H05K
7/20736; H05K 7/20136; H05K 7/20;
H05K 7/20163; H05K 7/2039; F28F 3/02;
F28F 3/12; F28F 13/06
USPC .. 361/695, 679.49, 694, 679.48, 679.5, 690,
361/679.46, 704, 720, 692, 710, 688;
165/80.3, 104.33, 80.2, 126, 104.14
See application file for complete search history.

(56) References Cited

U.S. PATENT DOCUMENTS

| | | |
|---|---|---|
| 6,538,888 B1 | 3/2003 | Wei et al. |
| 6,643,131 B1 | 11/2003 | Huang |
| 6,665,497 B1* | 12/2003 | Hamilton-Gahart ........................ H04B 10/2513 385/24 |
| 7,848,101 B2 | 12/2010 | Dey et al. |
| 8,422,218 B2 | 4/2013 | Fried et al. |
| 9,022,098 B2* | 5/2015 | Hofmann .................. F28D 1/06 165/121 |
| 2005/0259393 A1* | 11/2005 | Vinson ...................... G06F 1/20 361/690 |
| 2006/0275119 A1* | 12/2006 | Liang ...................... F01D 5/186 416/97 R |
| 2007/0188995 A1 | 8/2007 | Franz et al. |
| 2008/0024982 A1* | 1/2008 | Holland ............. H05K 7/20581 361/695 |
| 2009/0073652 A1 | 3/2009 | Matser et al. |
| 2011/0182027 A1 | 7/2011 | Lima et al. |
| 2014/0063737 A1 | 3/2014 | Desmarets |
| 2014/0166235 A1 | 6/2014 | Von Hessling et al. |
| 2014/0342652 A1 | 11/2014 | Dong et al. |
| 2015/0305198 A1* | 10/2015 | Brandt ............... H05K 7/20218 361/699 |

* cited by examiner

DEFLECTION OF HEATED AIR FROM A POSTERIOR ELECTRICAL COMPONENT

BACKGROUND

As global demand for data exchange has grown, so does a size and load placed on a server. As such, servers generate exponentially more power thus producing more heat.

BRIEF DESCRIPTION OF THE DRAWINGS

In the accompanying drawings, like numerals refer to like components or blocks. The following detailed description references the drawings, wherein.

DETAILED DESCRIPTION

As servers generate more heat, efficiently cooling the electrical components has become a concern. Several approaches have been implemented to provide cooling advances. One such approach provides liquid cooling which routes a coolant through pipes in and around the electrical components to prevent overheating. The liquid cooling approach uses a specially designed infrastructure which increases the cost and space of the cooling system.

In an air cooling approach, excess heat is removed from the system by forcing air through a server enclosure and over heat generating components (e.g., electrical components). Air cooled heat sinks enhance heat transfer into the passing air and heat is removed from the system as air exits the enclosure. A typical air cooled system may use a serial heating approach in which cool air is routed in a front-to-rear cooling process. In the serial heating approach, cool air is routed from the front electrical components to the rear components; however, the serial heating approach has its limitations as air heated by the front electrical components may be too hot to adequately cool the electrical components in the rear. This heating approach produces a pre-heated effect from the front electrical component to other downstream electrical components. For example, air delivered to the electrical components in the rear of the system is often above room temperature, resulting in inefficient cooling. Additionally the serial heating approach restricts equipment density within the server as the overall number of electrical components are limited to provide adequate cooling.

To address these issues, examples disclose an effective cooling system which deflects heated air from downstream electrical components. The cooling system includes a transition section between multiple ducts. The transition section includes a first air channel and a second air channel which are separated or segmented from one another by an internal partition. The first channel receives heated air from an electrical component which is deflected away from a posterior electrical component by the internal partition. The posterior electrical component is the component which is downstream in an airflow. The second channel receives cool air which is delivered to the posterior component. Using the internal partition to segregate the air channels, ensures the temperature of the cool air in the second channel remains unaffected by the heated air in the first channel. Additionally, using multiple air channels means air is delivered in parallel to the electrical components. This prevents, pre-heating the air from the earlier cooled electrical components.

In another example, the internal partition serves as a guide vane to rotate each of the air channels in the transition section. In this example, each of the air channels are rotated between the electrical components, which in turn causes an inflection of cool air onto the downstream electrical components and deflection of the heated air away from the downstream electrical components. This allows heat to be extracted from the system without affecting the downstream of electrical components.

In a further example, the ducts located on either side of the transition section are each partitioned. The partition of each duct provides air channels which are coupled with the air channels in the transition section to form contiguous air passages. Providing contiguous air passages, cool air is routed to each electrical component in the series of electrical components. This allows for a denser and/or deeper depth of electrical components in a server without regard to limiting the number components.

Figure 1:
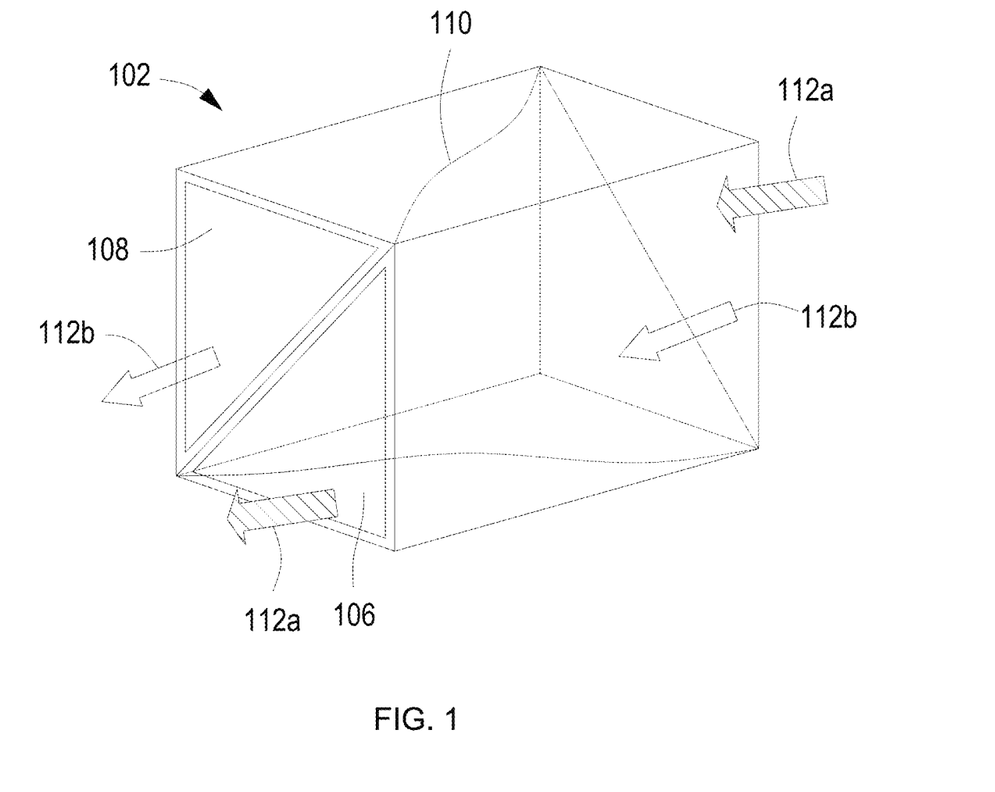
FIG. 1 illustrates a side perspective of an example transition section including multiple channels in accordance with the present disclosure.

FIG. 1 illustrates a side perspective of a transition section 102 including a first channel 106 and a second channel 108. The airflow through each channel 106 and 108 is separated by an internal partition 110. The transition section 102 includes sides or walls that create the external framework. The external framework provides the supporting structure of the transition section 102. In an implementation, the transition section 102 is a helical type of duct that has a shape or form of a helix to create the rotation of the internal partition 110. The transition section 102 including the framework and internal partition 110 may be composed of various materials such as a thermally resistive material which prevents heated air 112a in the first channel 106 from affecting cool air 112b in the second channel 108. For example, the transition section 102 and other connected parts may be composed of a thermally resistive material such as ceramic, plastic, polyurethane, foam, or other type of material.

The first channel 106 receives heated air 112a from an electrical component (not illustrated). Upon receiving the heated air 112a, the airflow is pushed through the first channel 106 and subsequently deflected away from a posterior component. The deflection of the airflow is created by a curvature of a partition wall 110 internal to the transition section 102, such that the heated air 112a entering the transition section 102 along, for instance, a top channel and is deflected to a bottom channel before exiting the transition section 102. This deflection is illustrated with a redirection of the airflow as indicated with the arrow. The heated airflow 112a enters the first channel 106 and is redirected by the curvature of the internal partition 110 as observed in the heated airflow exiting the first channel 106. In this implementation, the heated airflow 112a is deflected away from the subsequent posterior component through the curvature of the internal partition 110. The deflection is caused by the rotation of the internal partition 110 such that the heated airflow through the first channel 106 is turned aside or deflected from a straight course. This deflection enables the first channel 106 to couple with a partitioned channel in a subsequent duct to provide a continuous airflow path that is deflected from other electrical components downstream. In this manner, the deflection of the heated air 112a means the path of heated air is adjusted so instead of continuing straight through, the heated air 112a is adjusted to a different path. This implementation may be explained in detail in later figures.

In terms of the order of the electrical components receiving the airflow, the initial electrical component is considered a first electrical component in the stream of an airflow, while the posterior electrical component is considered the electrical component located in the downstream of the airflow. If the series of electrical components were illustrated in FIG. 1, the electrical component would be located to the right of transition section 102 and the posterior electrical component would be located to the left of the transition section 102. The series of electrical components including an initial electrical component, posterior electrical component, and subsequent posterior electrical components are discussed in detail in later figures.

The second channel 108 receives cool air and in turn inflects the cool air 112b onto the posterior or subsequent electrical component in the airflow. The inflection is observed by the cool air 112b entering the channel 108 and redirected to inflect on the posterior electrical component. The inflection is caused by the rotation of the curved internal partition 110 that results in curving or bending the cool air 112b that results in directing the cool air 112b on a different path.

The first channel 106 and the second channel 108 are air channels within the transition section 102 which enables the routing of the airflow. As such implementations of the first channel 106 and the second channel 108 include an airflow channel, chamber, partition, segmentation, duct, conduit, tube, or other type of air channel which allows the flow of air through the transition section 102.

The internal partition 110 is a stationary wall which curves as to create the rotation of the channels 106 and 108. The internal partition 110 separates the first channel 106 and the second channel 108 to divide the transition section 102 into isolated or segmented air channels. Segmenting the air channels ensures cool air 112b in the second channel 108 remains unaffected by the heated air 112a in the first channel 106. The internal partition 110 is rotated or curved in such a manner that the airflow in each of the channels 106 and 108 are adjusted to different paths. Upon going through the rotation of the internal partition 110, the heated air 112a is redirected to exit the transition section 102 on the left half while the cool air 112b may be redirected to exit the transition section 102 on the left half. In this manner, the internal partition 110 provides the guide vane to rotate the path of the airflow through the channels 106 and 108.

In an implementation, the transition section 102 is coupled between multiple ducts to create a cooling system. In this implementation, each duct includes multiple partitions which correspond to the channels 106 and 108. Theses partitions are coupled to each channel 106 and 108 such that allows a continuous flow of air from one duct, through the transition section, and into another duct. This is explained in detail in the next figure.

Figure 2A:
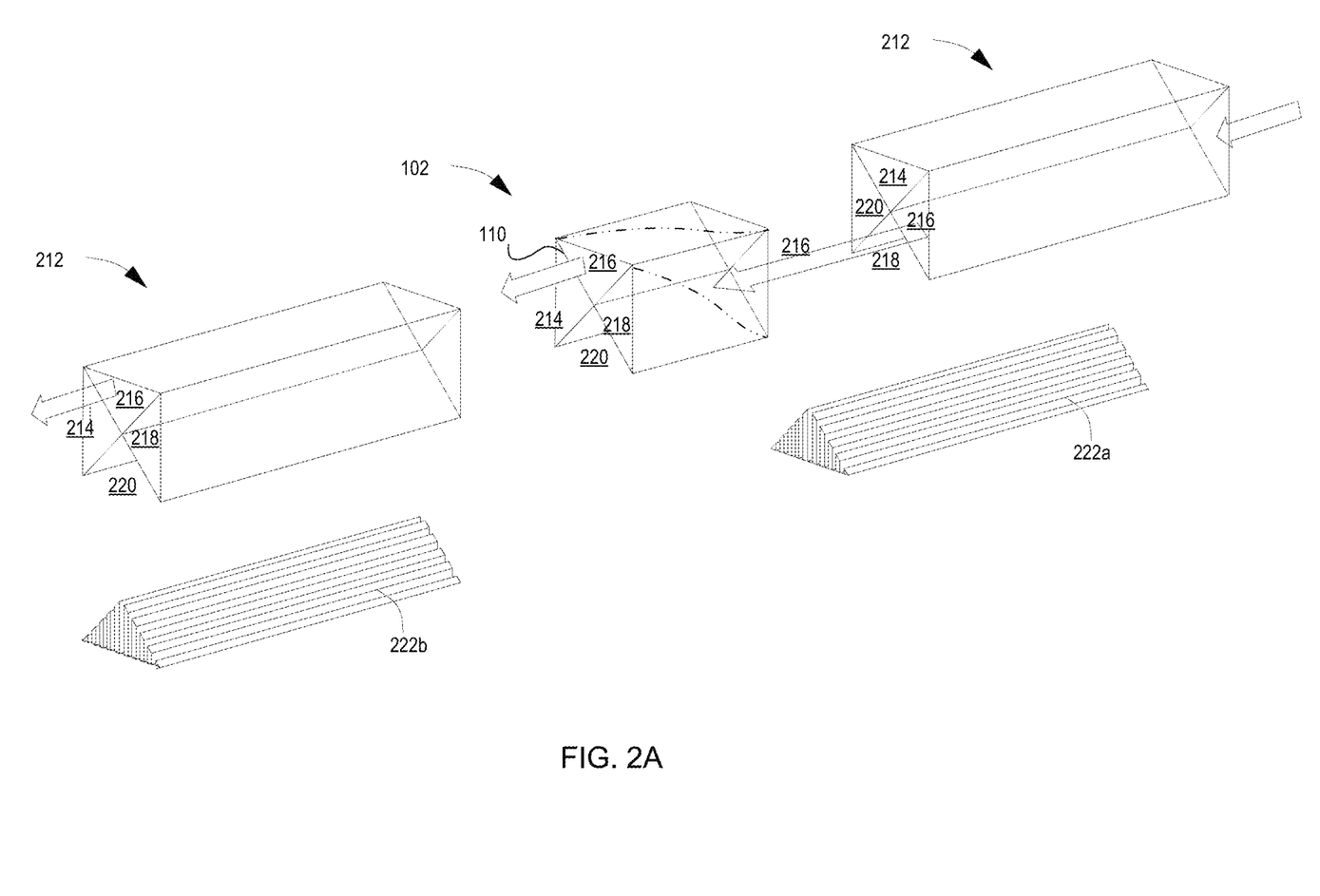
FIG. 2 illustrates an exploded diagram of an example cooling system including an airflow through the cooling system in accordance with the present disclosure.

FIG. 2 illustrates an exploded side perspective of a cooling system including an airflow through the system. The cooling system includes a transition section 102 between ducts 212. The transition section 102 includes four air channels 214-220 which couple with conduits 214-220 (e.g., other air channels) in each duct 212 to form contiguous passages. The contiguous passages route cool air to each electrical component in the series. The partitions 110 in the transition section 102 rotate each channel to deflect heated air from the posterior or downstream electrical components.

The ducts 212, located above each heat sink 222a-222b, are partitioned into air conduits 214-220 to provide for the delivery and removal of air in the system. The air conduits 214-220 are similar to the air channels 214-220 in the transition section 102, but without the rotated internal partitions 110.

The heat sinks 222a-222b are passive heat exchangers which transfer the heated generated by each electrical component into the air conduit located above each respective heat sink 222a-222b. As such, each heat sink 222a-222b is thermally coupled to a different electrical component to extract the heat for routing out of the system. In an implementation, the order of the heat sinks 222a-222b is dictated by the airflow. For example, if the airflow moves from right to left, the order of the heat sinks 222a-222b follow. In this example, the heat sink 222a on the right is the first heat sink while the heat sink 222b on the left is the second heat sink. Implementations of the heat sinks 222 include, by way of example, a heat transfer device, heat exchanger, or other type of heat extracting device.

In a specific implementation of the cooling system, the transition section 102 rotates each of the channels 214-220 by 90 degrees between each heat sink 222a-222b. As such, the exploded diagram in FIG. 2 depicts a portion of the cooling system as it cools two heat sinks 222a-222b. A fan blows air into the conduits 214-220 of the duct 212 from the far right. Air flows through the bottom conduit 218 of the initial duct 212 cools the initial heat sink 222a. The airflow in the other three conduits 214, 216, and 220 remains cool. Between both ducts 212, air flows through the transition section 102 with internal partitions 110 that rotate each channel 214-220 by 90 degrees. In the second duct 212, the previously heated air in channel 218 from the first heat sink 222a flows along the side of the second duct 212. The unheated air or cool air which was previously in channel 220 cools the second heat sink 222b. The process is repeated to cool remaining heat sinks which are thermally coupled to the electrical components. The four conduit channels each cool a different heat sink and in turn, electrical component. The heated air is then carried out of an enclosure without affecting other downstream electrical components.

Figure 3A:
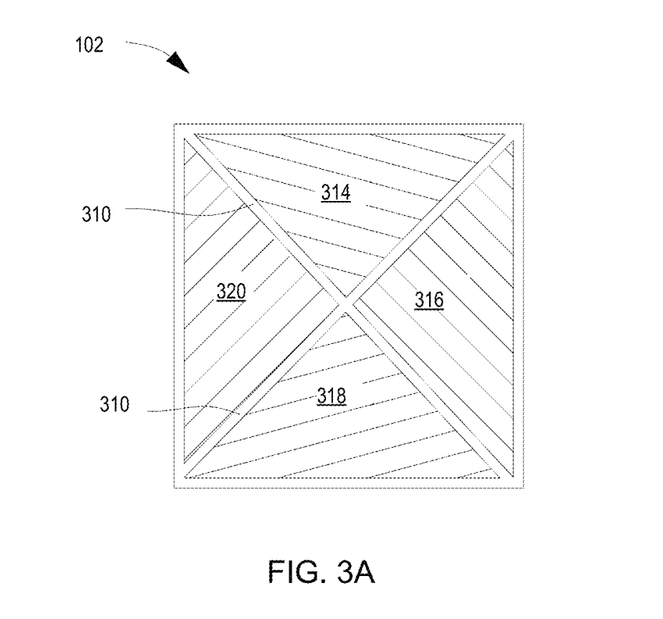
FIG. 3A illustrates a cross-sectional view of an example transition section in accordance with the present disclosure.

FIG. 3A illustrates a cross-sectional view of an transition section 102 including multiple channels 314-320 which are segmented by internal partitions 310. The channels 314-320 carry air to each electrical component for cooling and routes heated air away from downstream or posterior electrical components. The transition section 102 includes straight walls or sides to create an outer framework. The channels 314-320 are considered airflow channels to receive heated air and provide cool air routed from a duct 212, accordingly. Initially, in this implementation, the channel 318 receives the heated air from channel 318 in the duct 212. The duct 212 is placed above a heat sink (not illustrated) to route the heated air. The other channels 314, 316, and 320 receive cool air from the corresponding channels 314, 316, and 320 in duct 212. The transition section 102 also includes internal partitions 310 to provide a boundary that allows each of the channels 314-320 to receive air from the duct 212 without mixing or combining the airflows. In FIG. 3A, internal partitions 310 rotate or twist at an angle such that the airflows through the channels 314-320 may be deflected away from electrical components or inflected into the electrical component. For example, upon receiving heated air from channel 318 in the duct, the channel 318 is rotated by the internal partition 310 which cause the airflow in channel 318 to deflect away from downstream electrical components. In an implementation, internal partitions 310 create a helical shape to deflect heated air away from downstream electrical component(s). Although FIG. 3A illustrates four channels 314-320, this was done for illustration purposes as the transition section 102 may include more than four channels or less than four channels. In implementations, the transition section 102 includes at least two of the channels 314-320. The number of channels in the transition section 102 is dependent on a number of internal partitions 310. For example, a greater number of partitions means a greater number of channels. Additionally, even though the side walls to the transitions section 102 and ducts 112 are illustrated as straight walls, this was done for illustration purposes as there may be several variations of shapes to the side walls.

Figure 3B:
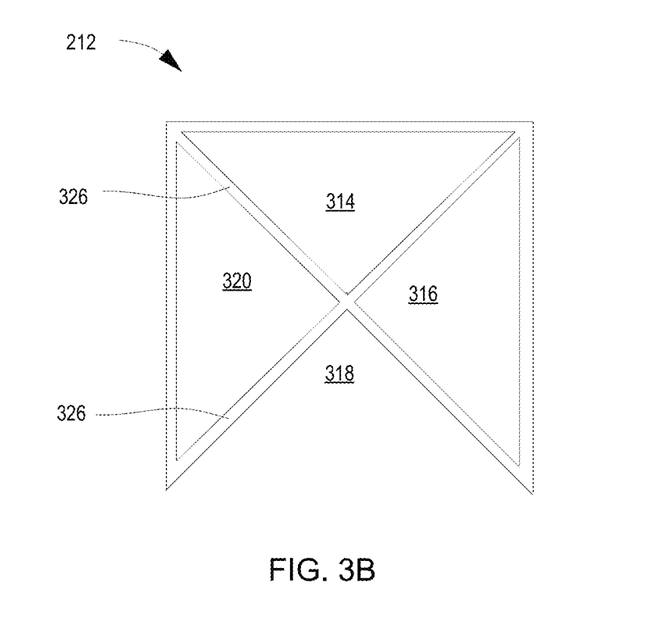
FIG. 3B illustrates a cross-sectional view of an example duct in accordance with the present disclosure.

FIG. 3B illustrates a cross-sectional view of an example duct 212 include multiple channels 314-320 as created by partitions 326. The channels 314-320 are divisions internal to the duct 212 which receive airflow from a fan. The duct 212 includes a framework of at least three walls. The channel 318 without the side or wall is placed above a heat sink (not illustrated) so the heated air may flow from channel 318 in the duct 212 to the corresponding channel 318 in the transition section 102. In this example, channel 318 corresponds to channel 318 in FIG. 3A to receive heated air. In turn, the heated airflow is deflected or directed away through the curve of the rotation of internal partitions 310. This isolates and controls the heated airflow so the heated airflow does not affect other components in a series of electrical components. The coupling of transition section 102 and the duct 212 may be referred to as the duct assembly. In this implementation, the channels 314-320 in the duct 212 correspond to the channels 314-320 in the transition section 102 such that a continuous airflow is provided from the duct 212 through the transition section 102 and into additional ducts.

Figure 4A:
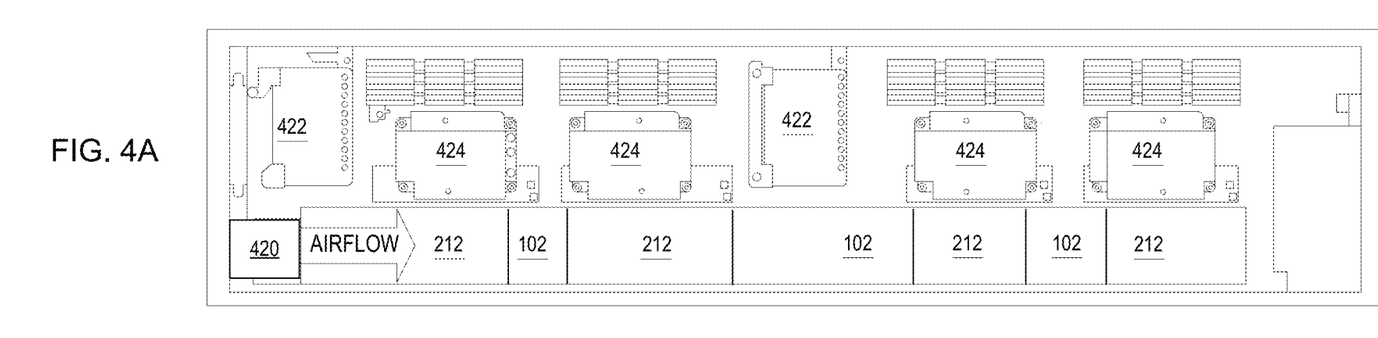
FIG. 4A illustrates a perspective view of an example cooling system including a sequence of a flow of air through the cooling system in accordance with the present disclosure.

FIG. 4A illustrates a top perspective view of a flow of air through components in a cooling system. The cooling system includes module boards 422 to support electrical components 424 for cooling. Heat sinks (not illustrated) are mated between the line of components 102 and 212 and the electrical components 424. A cooling fan 420 provides the airflow to a duct assembly. To cool each electrical component 424, the cooling system includes ducts 212 to receive the airflow from the fan 420. The ducts 212 each include multiple partitions or segments which receive heated and cooled air for moving through the system. The ducts 212 are connected to transition sections 102 which include an internal partition (not illustrated) which curves to create a rotation between the multiple channels and providing unheated air to each of the electrical components 424. The electrical components 424 include both an initial electrical component and downstream and posterior electrical components 424. The electrical components which are considered posterior are those components downstream in the airflow. In this implementation, since the airflow is going from left to right, the initial component is the first electrical component on the left while the posterior electrical components are those components downstream. In another example, if the airflow was pushed from right to left, the initial electrical component would be the farthest right electrical component while the posterior and/or subsequent electrical components are those components to the left of the farthest right electrical component. The electrical components 424 are hardware electrical parts in a system including the circuitry which generates much heat. As such implementations of the electrical components 424 include a processing component, transducer, semiconductor, controlling component, optical component, application-specific integrated circuit (ASIC), central processing unit (CPU), integrated circuit, processing resource, memory modules, or other type of hardware component capable of generating heat. Although FIG. 4A illustrates each electrical component 424 as parallel to each duct 212 and transition section 102, this was done for illustration purposes. As the duct assembly including the respective duct 212 and transition section 102 may be placed perpendicularly or may be coupled directly to the electrical component 424 for cooling purposes.

Figure 4B:
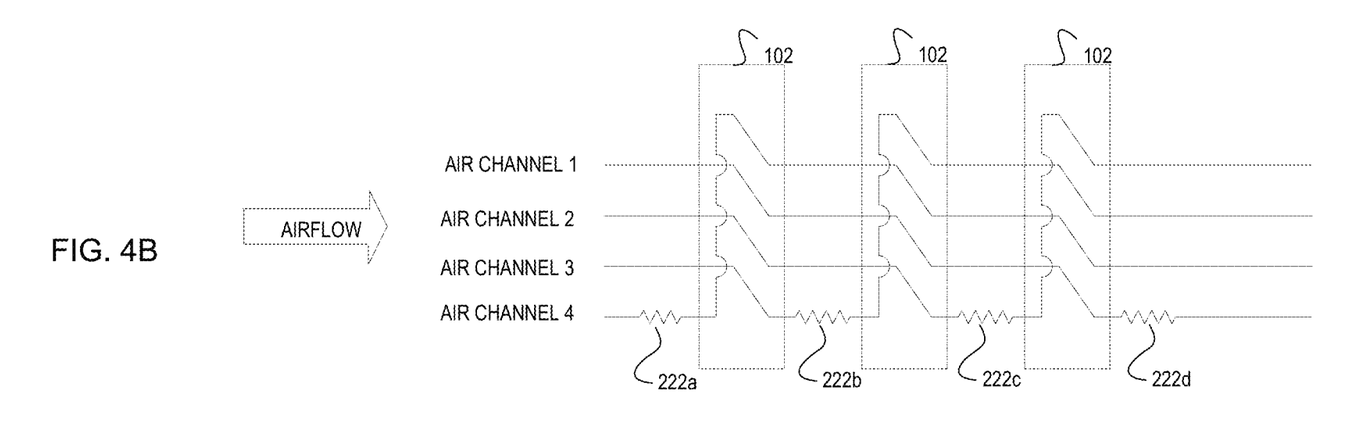
FIG. 4B illustrates an example diagram of airflow through various channels in accordance with the present disclosure.

FIG. 4B represents an example diagram of the airflow in each of the channels of the cooling system illustrated in FIG. 4A. Each channel includes the ducts and transition section 102 to create a contiguous airflow path. Each resistive element in FIG. 4B represents the airflow over a heat sink 222a-222d which turns into heated air. As such, upon reaching the transition section 102, each channel is deflected to a different path. For example, the first air channel receives air and upon reach the first transition section 102, the channel is rotated to the path of the second channel. In another example, the fourth channel received the heated air as indicated with the resistive element 222a. In receiving the heated air, upon reaching the first transition section 102, the heated air is deflected.

Figure 4C:
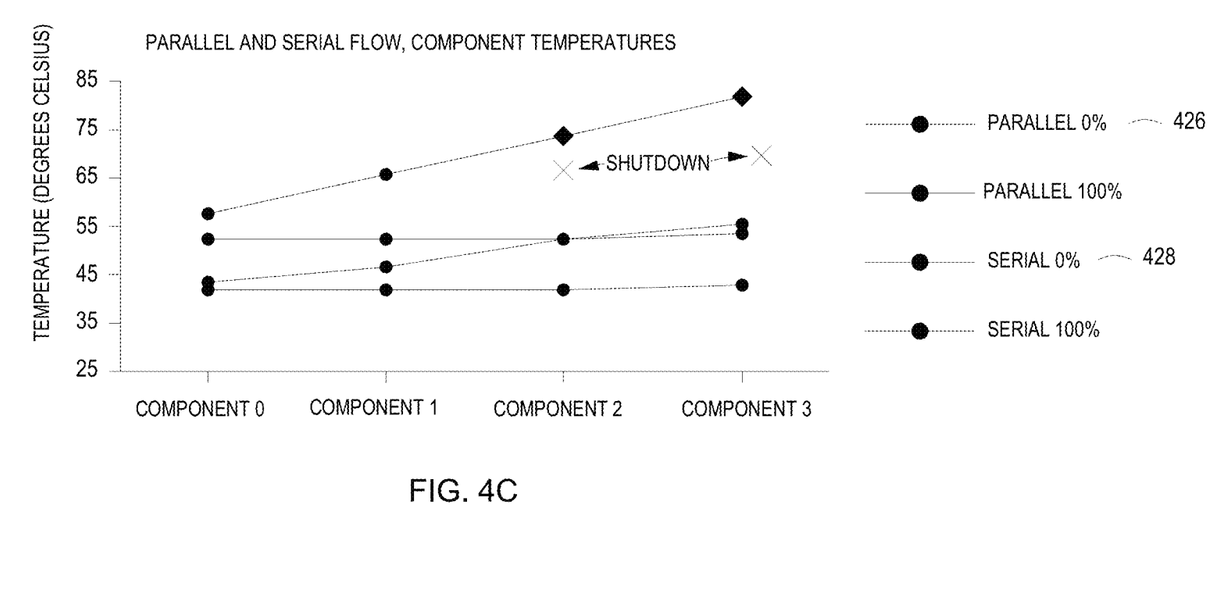
FIG. 4C illustrates an example graph of the cooling system in FIG. 4A in accordance with the present disclosure.

FIG. 4C illustrates an example graph representing temperature differences in electrical components in different cooling configurations. The graph includes temperature differences between a serial cooled configuration 428 and a transition section duct cooling system, referred to as the parallel cooled configuration 426. The parallel cooled configuration 426 airflow is depicted above in regards to FIG. 4A. The electrical components (0, 1, 2, and 3) represent an initial electrical component and the posterior or subsequent electrical components. In this example, the initial electrical component is the electrical component where the airflow is initiated for cooling purposes. The posterior or subsequent electrical components are those components which are considered downstream from the airflow. The electrical components for each configuration 426 and 428 are measured at a 0% load and a 100% load to measure temperature differences (in Celsius) between the configurations 426 and 428. The 0% load corresponds to a state where the electrical components are idle, while the 100% load corresponds to a state where the electrical components are fully occupied.

For the parallel cooled configuration 426, at a load of 0% and 100%, the temperatures of the electrical components remain unchanged for each of the four electrical components. In this implementation, there is minimal temperature difference between the initial electrical component and the subsequent or posterior electrical components. This means the fourth electrical component is just as cool as the first electrical component.

The serial cooled configuration 428 represents the serial cooling approach where cool air is routed from the front to the rear electrical components. At 0% load, the fourth electrical component was 12 degrees warmer than the initial electrical component. At the 100% load, the third and fourth electrical components experience temperatures which create a thermal shutdown before reaching stable operating temperatures. After stabilization, the second electrical component is 8 degrees warmer than the initial electrical component. Projecting the performance to the fourth electrical component, produces an estimated operating temperature of 81.6 degrees, which is 28.1 degrees warmer than the fourth electrical component in the parallel cooled configuration 426.

Figure 5:
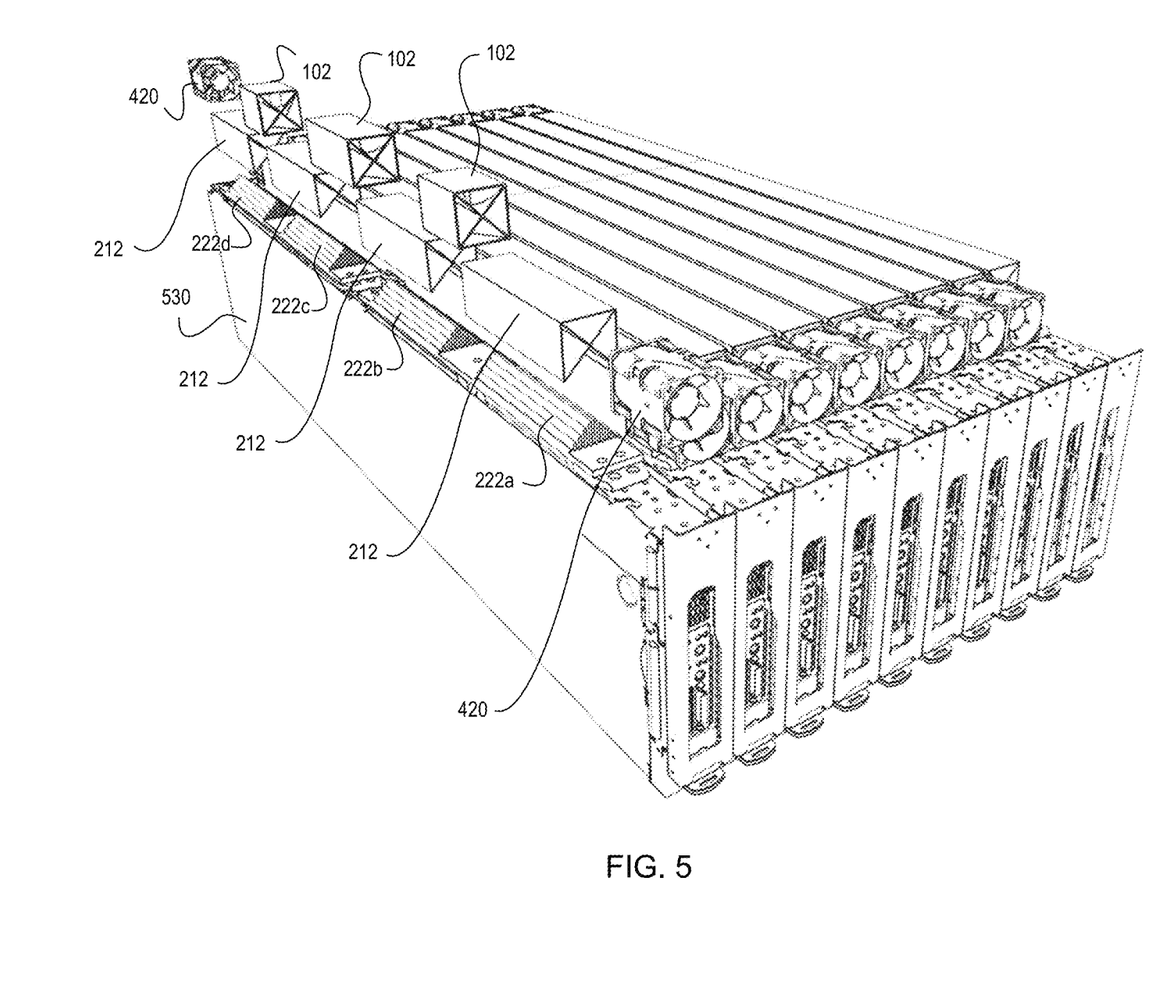
FIG. 5 illustrates an example cooling system in accordance with the present disclosure.

FIG. 5 illustrates an example cooling system as implemented in a computing system. The cooling system includes a parallel cooled configuration with various transition sections 102 and ducts 212 to provide cooling for a series of electrical components (not illustrated). The parallel cooled configuration includes the series of electrical components, each series on a different module board. Each module board is parallel to one another. The cooling system using the various transition sections 102 and ducts 212 to allow for a deeper and denser electronic configurations. The transition sections 102 includes multiple channels, are placed in between the ducts 212. In this implementation, the transition sections 102 include four channels which are segmented from each other with two different internal partitions (not illustrated). The transition section 102 receives heated air from a partition or segmentation within the duct 212. The ducts 212 are each located above a heat sink 222a-222d. The heat sinks 222a-222d extract thermal energy from a series of electrical components (not illustrated). The series of electrical components are located on modules facing towards the front of the rack or enclosure 530. In this implementation, cool air is taken in by the duct 212 to provide the airflow through the segmentations of the duct 212. In turn, the segmentation in the duct 212 closest to the heat sink 222a provides heated air to a first channel of the transition section 102. The transition section 102 deflects the heated air through a curvature as to create a rotation of the internal partitions. The deflection of the air in the transition section 102 redirects the heated airflow from the segmentation closest to the heat sink 222a to the other segmentations for routing out of the rack 530.

Figure 6:
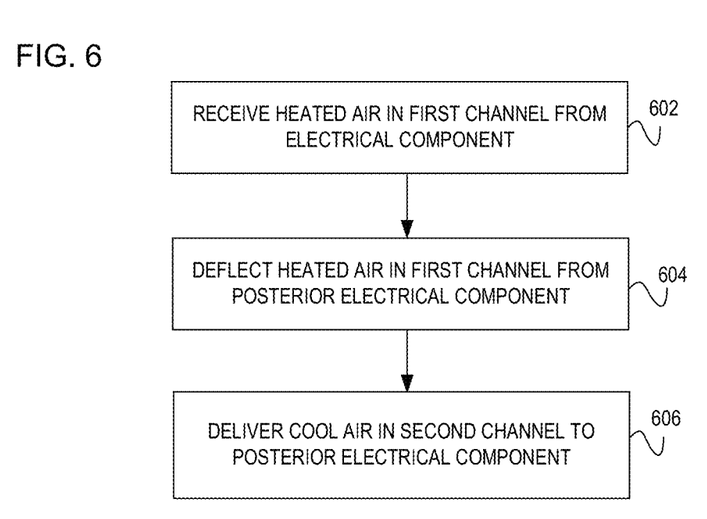
FIGS. 6-7 illustrate example flow diagrams for deflecting heated air from a posterior electrical component in accordance with the present disclosure.
Figure 7:
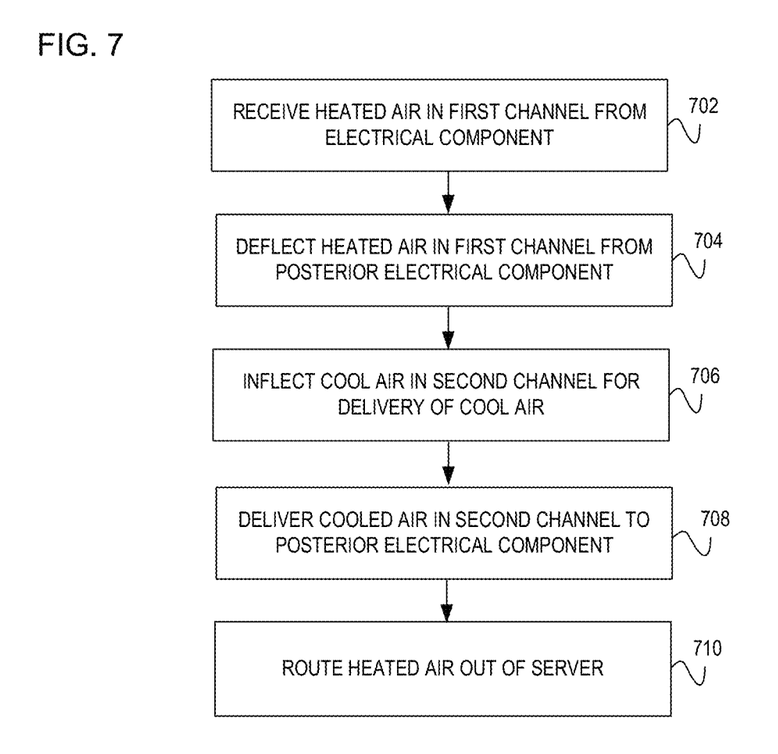

Referring now to FIGS. 6 and 7, flow diagrams are illustrated in accordance with various examples of the present disclosure. The flow diagrams represent processes that may be utilized in conjunction with various systems and devices as discussed with reference to the preceding figures. While illustrated in a particular order, the flow diagrams are not intended to be so limited. Rather, it is expressly contemplated that various processes may occur in different orders and/or simultaneously with other processes than those illustrated.

FIG. 6 is a flow diagram illustrating a method of delivering cooled air to a posterior electrical component. The method as illustrated in FIG. 6 depicts an operation of a transition section to deflect heated air away from the posterior electrical component. The transition section or apparatus includes at least two channels to direct a flow of air over a series of electrical components. The method may begin by receiving heated air in the first channel from an electrical component. Upon receiving the heated air in the first channel, the apparatus deflects the heated air in the first channel. The deflection of the heated air away from the posterior component is caused by a curvature of an internal partition that creates a rotation of the channels. Upon the deflection of the heated air, a second channel within the transition section delivers cool air to the posterior component. Deflecting the heated air received from the electrical component away from the posterior electrical component, prevents mixing of the heated air to cool the downstream components. Overall, this reduces the operating temperatures of the electrical components. In discussing FIG. 6, operations 602-606 may be performed by components in FIGS. 1-5. As such, references may be made to such components for purposes of clarification and not to limit such implementations. For example, the transition section 102 may be coupled to the ducts 212 for operation of the cooling system.

At operation 602, the transition section receives the heated air in the first channel from the electrical component. The heated air may be produced by a heat sink which operates in conjunction with the electrical component to pull heat away. The resulting air (i.e., the heated air) then flows through the first channel of the apparatus.

At operation 604, the transition section deflects the heated air in the first channel. The deflection of the heated air includes directing the heated air away from an airflow to the posterior electrical component. The deflection is caused by a curvature of the internal partition. The internal partition provides a wall that separates the first channel from the second channel. This ensures the two channels have two different airflows, each airflow directed to a different electrical component in a series of electrical components. The rotation of the internal partition is a twist of the partition such that interrupts a direct airflow. This means the heated airflow is directed to an isolated channel to prevent the heated air from affecting other components in the series.

At operation 606, the transition section delivers cool air in the second channel to the posterior electrical component. In this implementation, the rotation of the internal partition causes the cool airflow in the second channel to inflect towards the posterior electrical component. The internal partition is shared between the first channel and the second channel to provide segregation of the channels from one another. This prevents commingling of the airflows to cool a subsequent electrical component in the series of components.

FIG. 7 is a flowchart of an example method to deflect heated air from a posterior electrical component through a rotation of an internal partition. The method as illustrated in FIG. 7 depicts an operation of a transition section or apparatus to deflect heated air away from the posterior electrical component. The apparatus receives the heated air from an electrical component. The heated air is received in a first channel and is deflected away from the posterior electrical component. The deflection of the heated air in the first channel is caused by a partition internal to the apparatus which rotates to redirect the heated air. The cool air received in a second channel of the apparatus is inflected to cause the delivery of the cool air to the posterior component. The inflection of the cool air is caused by the internal partition which includes a curvature to create the rotation of the air channels. Inflecting the cool air in the second channel, the cool air is delivered to the posterior electrical component. The heated air which was deflected in the first channel is routed out of an enclosure to prevent mixing with airflows in other channels. In discussing FIG. 7, operations 702-710 may be performed by components in FIGS. 1-5. As such, references may be made to such components for purposes of clarification and not to limit such implementations. For example, the transition section 102 may be coupled to ducts 212 for operation of the cooling system.

At operation 702, the first channel receives the heated air from the electrical component. The electrical component is considered an initial electrical component in a series of electrical components. As such, the circuitry and material of the electrical component generates heat during operation. This heat generation produces the heated air is received in a first duct which is adjacent to a heat sink. The heat sink is connected to the electrical component such that the heat sink absorbs the heat or thermal energy which produces the heated air. Operation 702 may be similar in functionality to operation 602 as in FIG. 6.

At operation 704, the apparatus deflects the heated air received in the first channel. The deflection of the heated air redirects the heated air away from the posterior electrical component. The deflection is caused by the rotation of the internal partition. The internal partition separates the first channel from the second channel such that each airflow in the respective channel is isolated from another. Operation 704 may be similar in functionality to operation 604 as in FIG. 6.

At operation 706, the apparatus inflects the cold air in the second channel for delivery to the posterior electrical component. In one implementation, the first channel receives the heated air simultaneously as the second channel receives cool air. Upon receiving the cool air by the second channel, the rotation of the internal partition causes the cool to inflect to the posterior electrical component. The inflection is a bend or angle of the flow of the cool cooled air such that redirects the airflow to a channel in a duct for cooling the posterior component.

At operation 708, the apparatus delivers cool air to the posterior electrical component. In one implementation, the delivery of the cool air includes inflecting the cool air caused by the rotation of the internal partition. Operation 708 may be similar in functionality to operation 606 as in FIG. 6.

At operation 710, upon the deflection of the heated air in the first channel, the heated air is routed out of the enclosure. The enclosure is an area with the cooling system that is surrounded or closed off on all sides. The enclosure may include the series of electrical components and cooling system. In one implementation, the enclosure includes a server chassis while in another implementation, the enclosure includes a rack. As such, the first channel connects with a subsequent air duct to ensure the heated air is routed out of the cooling system.

Although certain embodiments have been illustrated and described herein, it will be greatly appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a variety of ways. This application is intended to cover adaptions or variations of the embodiments discussed herein. Therefore, it is manifestly intended that embodiments be limited only by the claims and equivalents thereof.

We claim:

1. An apparatus comprising: a first duct channel to: receive heated air from an electrical component; and deflect the heated air from a posterior component, the deflection caused by a curvature of an internal partition; and a second duct channel, segmented from the first duct channel via the internal partition, to provide cool air to the posterior electrical component, wherein the first duct channel and the second duct channel form a double channel helix; and wherein a third duct channel, segmented from the first duct channel and the duct second duct channel via a different internal partition, to: receive the cool air; and inflect the cool air for delivery to a subsequent posterior electrical component, the inflection caused by a curvature of the different internal partition.

2. The apparatus of claim 1 wherein to provide the cool air to the posterior electrical component, the second duct channel is to:
receive the cool air; and
inflect the cool air to the posterior electrical component, the inflection caused by the curvature of the internal partition.

3. The apparatus of claim 1, wherein the first duct channel is further to:
based on the deflection of the heated air, route the heated air out of the apparatus.

4. A cooling system comprising:
a first duct to route heated air from an electrical component;
a transition section, coupled between the first duct and a second duct, to:
deflect the heated air in a first channel from a posterior electrical component, and
inflect cool air in a second channel to the posterior electrical component,
wherein the first channel is segmented from the second channel via a partition;
a second duct to provide the cool air from the second channel in the transition section to the posterior electrical component, wherein the deflection is caused by a curvature of an internal partition; and
a third duct, segmented from the first duct and the third duct via a different internal partition, to;
receive the cool air, and
inflect the cool air for delivery to a subsequent porterior electrial component, the inflection caused by a curvature of the different internal partition.

5. The cooling system of claim 4, further comprising:
the second duct, coupled to the transition section, to provide the cool air from the segmented section to the posterior electrical component.

6. The cooling system of claim 5, wherein the transition section comprises:
the first channel to receive the heated air from the first duct; and
the second channel to deliver the cool air to the second duct.

7. The cooling system of claim 4, wherein the posterior electrical component is downstream in an airflow relative the electrical component.

8. The cooling system of claim 4, further comprising:
a first heatsink thermally joined to the electrical component; and
a second heatsink thermally joined to the posterior electrical component.

9. The cooling system of claim 4, wherein the transition section further comprises:
an internal partition to:
cause the deflection of the heated air from the electrical component and the inflection of the cool air through a rotation of each of the channels.

10. The cooling system of claim 4, wherein the first duct is partitioned to form contiguous passages with the first channel and the second channel of the transition section.

11. The cooling system of claim 4, wherein the first channel and the second channel form a double channel helix.

12. A method for cooling a series of electrical components, the method comprising: receiving heated air in a first duct channel from an electrical component; deflecting the heated air in the first duct channel away from a posterior electrical component, such that the deflection is caused by a curvature of an internal partition; and delivering cool air in a second duct channel to the posterior electrical component, wherein the second duct channel is segmented from the first duct channel via the internal partition and wherein the first duct channel and the second duct channel form a double channel helix; and wherein a third duct channel, segmented from the first duct channel and the second duct channel via a different internal partition, to: receive the cool air; and inflect the cool air for delivery to a subsequent posterior electrical component, the inflection caused by a curvature of the different internal partition.

13. The method of claim 12, wherein delivering the cool air in the second duct channel to the posterior electrical component comprises: the cool air in the second duct channel for delivery to the posterior electrical component, the inflection caused by the curvature of the internal partition.

14. The method of claim 12, further comprising based on the deflection of the heated air in the first duct channel, routing the heated air out of an enclosure.

\* \* \* \* \*